United States Patent
Ito et al.

(10) Patent No.: US 8,804,439 B2
(45) Date of Patent: Aug. 12, 2014

(54) POWER CIRCUIT, FLASH MEMORY SYSTEM PROVIDED WITH THE POWER CIRCUIT, AND POWER SUPPLY METHOD

(75) Inventors: Yugi Ito, Tokyo (JP); Norikazu Okako, Tokyo (JP); Kotaro Suzuki, Tokyo (JP); Katsuya Uematsu, Tokyo (JP)

(73) Assignee: TDK Corporation, Tokyo (JP)

( * ) Notice: Subject to any disclaimer, the term of this patent is extended or adjusted under 35 U.S.C. 154(b) by 281 days.

(21) Appl. No.: 13/468,213

(22) Filed: May 10, 2012

(65) Prior Publication Data

US 2013/0051151 A1 Feb. 28, 2013

(30) Foreign Application Priority Data

Aug. 23, 2011 (JP) ................................ 2011-181851

(51) Int. Cl.
*G11C 5/14* (2006.01)
(52) U.S. Cl.
CPC ....................................... *G11C 5/147* (2013.01)
USPC ................................ 365/189.09; 365/185.33
(58) Field of Classification Search
CPC ........................................................ G11C 5/147
USPC .......................................... 365/189.09, 185.33
See application file for complete search history.

(56) References Cited

U.S. PATENT DOCUMENTS

| 7,873,854 B2* | 1/2011 | Westwick et al. ............. 713/340 |
| 2009/0010080 A1* | 1/2009 | Fujioka et al. ........... 365/189.09 |

FOREIGN PATENT DOCUMENTS

| JP | 11-296430 A | 10/1999 |
| JP | 2001-209441 A | 8/2001 |
| JP | 4569541 B2 | 10/2010 |

OTHER PUBLICATIONS

Office Action dated Jul. 16, 2013 in the corresponding JP application No. 2011-181851.

* cited by examiner

*Primary Examiner* — Vu Le
(74) *Attorney, Agent, or Firm* — Posz Law Group, PLC

(57) ABSTRACT

A power circuit configured to supply an operating voltage to a memory controller configured to control a flash memory and an access to the flash memory, comprises an input side charging unit that is a charging unit configured to be charged by an input voltage that is supplied from the outside, a voltage regulation unit configured to regulate any higher one of the input voltage and a charging voltage of the input side charging unit to be the operating voltage and to output the voltage, an output side charging unit that is a charging unit configured to be charged by the operating voltage, and a discharging unit configured to discharge electricity that has been charged to the output side charging unit in the case in which any higher one of the input voltage and the charging voltage becomes lower than the setting value.

7 Claims, 5 Drawing Sheets

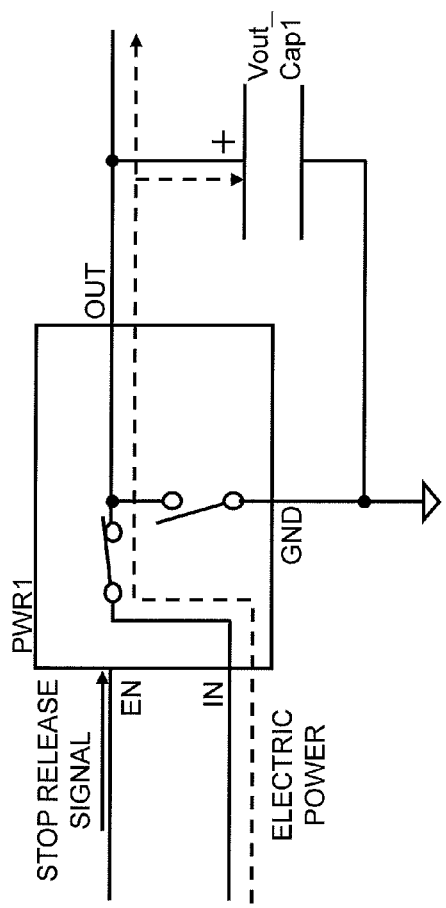
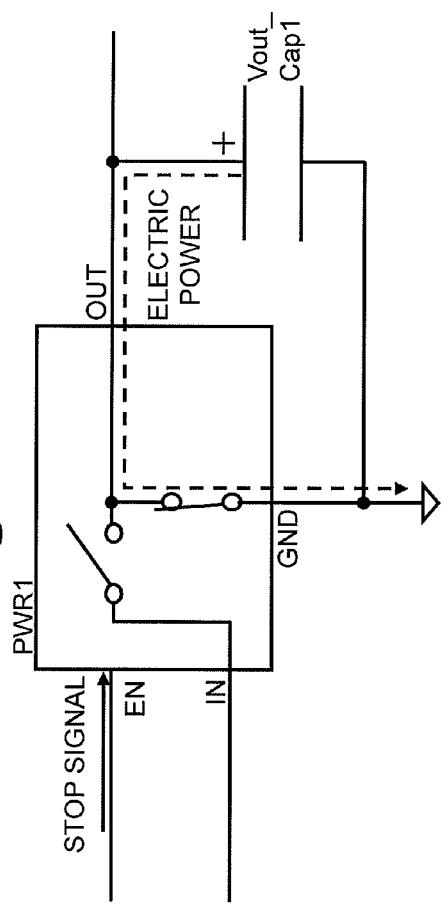

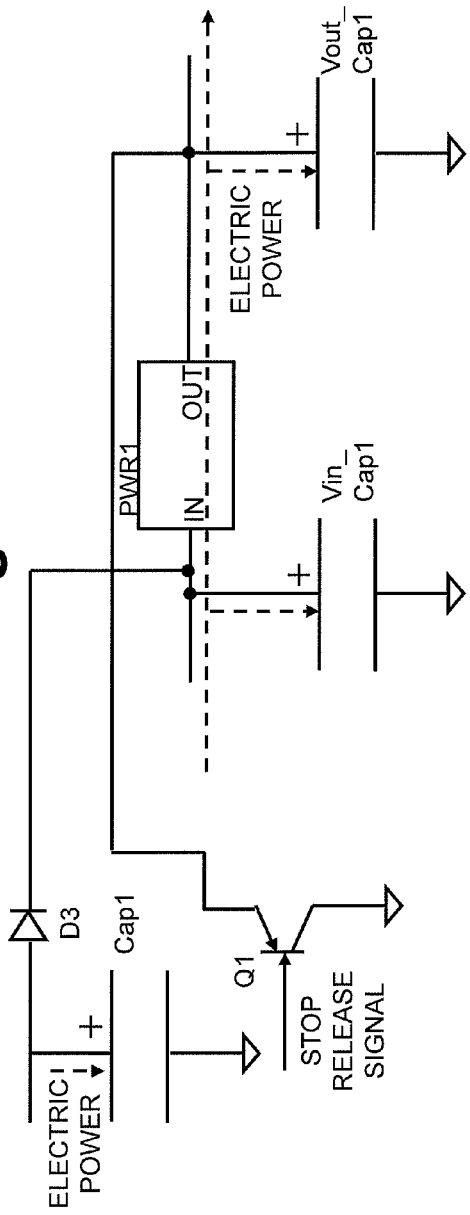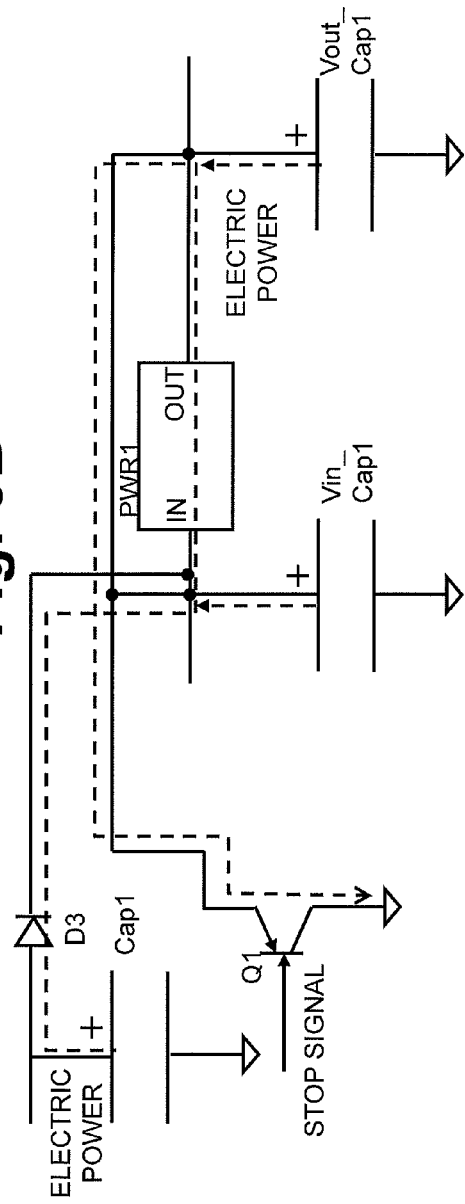

POWER CIRCUIT, FLASH MEMORY SYSTEM PROVIDED WITH THE POWER CIRCUIT, AND POWER SUPPLY METHOD

CROSS-REFERENCE TO PRIOR APPLICATION

This application relates to and claims the benefit of priority from Japanese Patent Application No. 2011-181851 filed on Aug. 23, 2011, the entire disclosure of which is incorporated herein by reference.

BACKGROUND

The present invention relates to a power circuit that is configured to supply an operating voltage to a flash memory and a memory controller configured to control an access to the flash memory, a flash memory system, and a power supply method. More specifically, the present invention relates to a power circuit, a flash memory system, and a power supply method that are suitable for releasing a failure caused by an interruption of an external power supply.

A power circuit that is disclosed in Patent Literature 1 is publicly known as a power circuit of this type. This power circuit is provided with a capacitor that is charged by an input voltage that is supplied from the outside (hereafter referred to as a backup input capacitor) and a voltage regulation circuit that is configured to regulate any higher one of an input voltage and a charging voltage of a backup input capacitor to be an operating voltage of a flash memory and a memory controller and to output the voltage. This power circuit discharges electricity that has been charged to the capacitor in the case in which any higher one of an input voltage and a charging voltage becomes lower than the setting value.

[Patent Literature 1] Japanese Patent Application Publication No. 4569541

SUMMARY

A capacitor is disposed on the output side of a voltage regulation circuit for the above power circuit. It is preferable that a charging voltage of a capacitor on the output side is lowered in a specified time.

An object of the present invention is to lower a charging voltage of a charging unit on the output side of a voltage regulation circuit that is included in a power circuit that is configured to supply an operating voltage to a flash memory and a memory controller configured to control an access to the flash memory in a specified time.

A power circuit in accordance with a first aspect is a power circuit configured to supply a first operating voltage to a flash memory and a memory controller configured to control an access to the flash memory. This power circuit comprises a first input side charging unit that is a charging unit configured to be charged by an input voltage that is supplied from the outside, a first voltage regulation unit configured to regulate any higher one of the input voltage and a charging voltage of the first input side charging unit to be the first operating voltage and to output the voltage, a first output side charging unit that is a charging unit configured to be charged by the first operating voltage and a discharging unit configured to discharge electricity that has been charged to the first output side charging unit in the case in which any higher one of the input voltage and the charging voltage becomes lower than the setting value.

Viewed from a second aspect, according to the first aspect, the discharging unit includes a detection unit configured to output a predetermined signal in the case in which the detection unit detects that any higher one of the input voltage and the charging voltage becomes lower than the setting value, and a switching element that is coupled to the first output side charging unit and that is configured to turn on in the case in which the predetermined signal is received.

Viewed from a third aspect, according to the second aspect, the power circuit is further comprised of a second input side charging unit that is a charging unit configured to be charged by a voltage that is any higher one of the input voltage and a charging voltage of the first input side charging unit and that is supplied to the first voltage regulation unit. The electricity that has been charged to the second input side charging unit is discharged from the switching element via the first voltage regulation unit.

Viewed from a fourth aspect, according to the first aspect, the first voltage regulation unit includes an input unit configured to receive any higher one of the input voltage and a charging voltage of the first input side charging unit, an output unit that is configured to output the first operating voltage based on an voltage that has been received by the input unit and that is coupled to a voltage side that is lower than the first operating voltage, a signal detection unit configured to receive a predetermined signal, and a discharging function configured to supply a charging voltage of the first output side charging unit to the lower voltage side by electrically disconnecting the input unit and the output unit in the case in which the signal detection unit receives the predetermined signal. The discharging unit includes the discharging function of the first voltage regulation unit, and a signal output unit configured to output the predetermined signal in the case in which a unit detects that any higher one of the input voltage and the charging voltage becomes lower than the setting value.

Viewed from a fifth aspect, according to at least any one of the first aspect to the fourth aspect, a power circuit includes a second voltage regulation unit configured to regulate any higher one of the input voltage and a charging voltage of the first input side charging unit to be a second operating voltage that is different from the first operating voltage and to output the voltage, and a second output side charging unit that is a charging unit configured to be charged by the second operating voltage. The discharging unit discharges electricity that has been charged to the first output side charging unit and the second output side charging unit in the case in which any higher one of the input voltage and the charging voltage becomes lower than the setting value.

A flash memory system according to the sixth aspect includes a power circuit according to any one of the first aspect to the fifth aspect, a flash memory configured to receive an operating voltage supplied from the power circuit, and a memory controller configured to receive an operating voltage supplied from the power circuit and configured to control an access to the flash memory.

A method according to the seventh aspect is a method for supplying an operating voltage to a flash memory and a memory controller configured to control an access to the flash memory. This method includes a step of regulating any higher one of an input voltage that is supplied from the outside and a charging voltage of a input side charging unit configured to be charged by the input voltage to be the operating voltage and outputting the voltage, and a step of discharging electricity that has been charged to the output side charging unit configured to be charged by the operating voltage in the case in which any higher one of the input voltage and the charging voltage becomes lower than the setting value.

In accordance with the present invention, a power circuit includes a first voltage regulation unit configured to regulate any higher one of an input voltage that is supplied from the outside and a charging voltage of the first input a charging unit configured to be charged by the input voltage to be a first operating voltage and to output the voltage, a first output side charging unit that is configured to be charged by the first operating voltage, and a discharging unit configured to discharge electricity that has been charged to the first output side charging unit in the case in which any higher one of the input voltage and the charging voltage becomes lower than the setting value. By this configuration, a charging voltage of the first output side charging unit of the first voltage regulation unit can be lowered in a specified time.

BRIEF DESCRIPTION OF THE DRAWINGS

FIG. 3A shows a concept of a voltage regulation circuit before a discharge function is exerted.

FIG. 3B shows a concept of a voltage regulation circuit when a discharge function is exerted.

FIG. 5A shows a state in which electricity is charged to an output side capacitor in the case in which a transistor is in an off state.

FIG. 5B shows a state in which electricity of an output side capacitor is discharged in the case in which a transistor is turned on.

DESCRIPTION OF THE EMBODIMENT

The embodiments of the present invention will be described below in detail.

Embodiment 1

Figure 1:
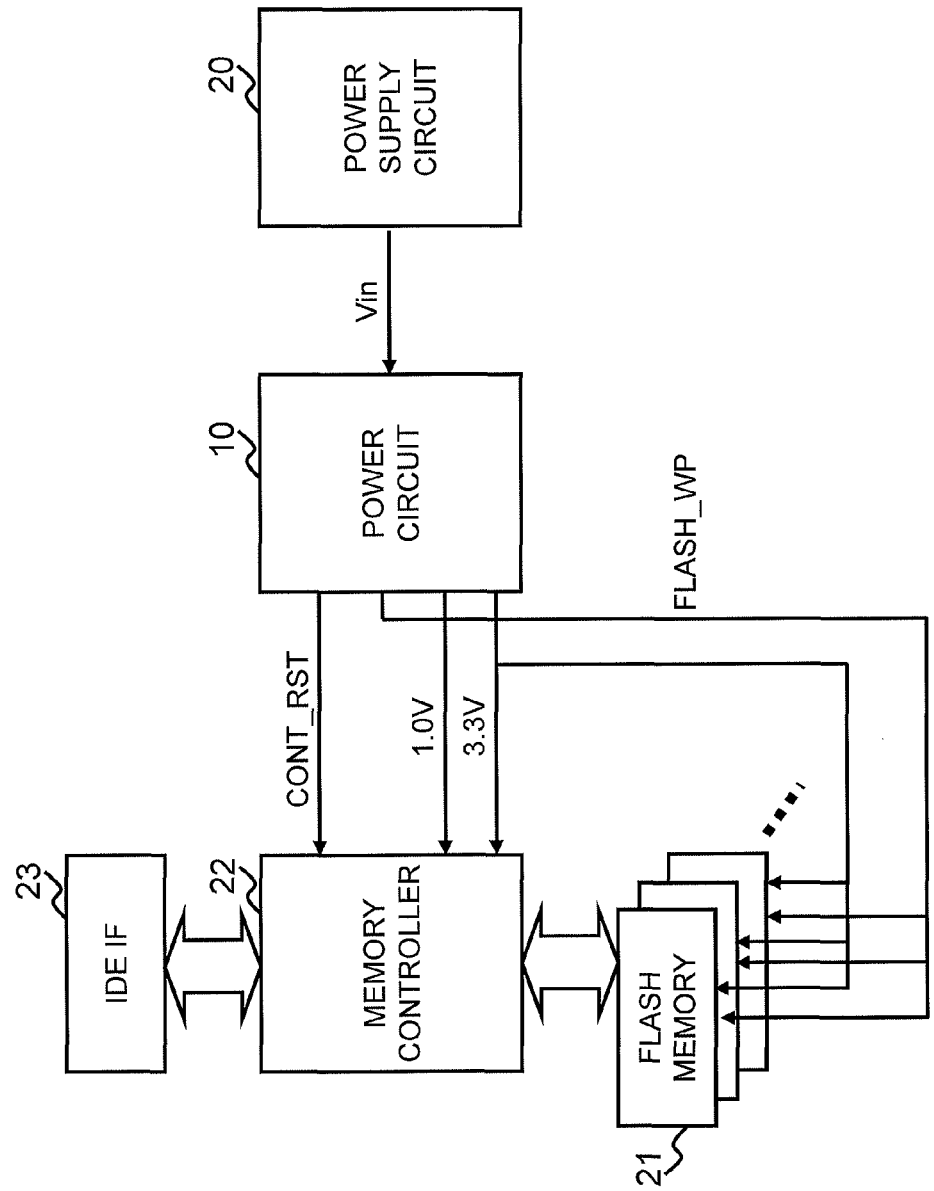
FIG. 1 shows a configuration example of a flash memory system in accordance with an embodiment 1 of the present invention.

FIG. 1 shows a configuration example of a flash memory system in accordance with an embodiment 1 of the present invention.

A flash memory system is coupled to a host system not shown via a predetermined interface apparatus such as an IDE (Integrated Drive Electronics) interface 23. The flash memory system is provided with a flash memory 21 in which the storage data is erased in a block unit, a memory controller 22 that is configured to control an access to the flash memory 21, and a power circuit 10 that is configured to supply an operating voltage to the flash memory 21 and the memory controller 22.

The memory controller 22 receives an instruction of writing and reading of data from the host system via the IDE interface 23, and transmits data that has been read from the flash memory 21 in accordance with an instruction of reading to the host system via the IDE interface 23.

The flash memory 21 is a flash memory in which data is input or output in a page unit that is smaller than a block unit for instance, that is, a flash memory of a NAND type in a quintessential way. However, the flash memory 21 is not limited to a flash memory of a NAND type.

The power circuit 10 regulates a power supply voltage (Vin) that is supplied from a power supply circuit 20 on the host system side to be an operating voltage and supplies an operating voltage that has been regulated to the flash memory 21 and the memory controller 22. In the present embodiment, a plurality of different operating voltages is supplied as an operating voltage. As an operating voltage, there is a first operating voltage and a second operating voltage that is lower than the first operating voltage for instance. The first operating voltage is 3.3 V (volt) for instance, and the second operating voltage is 1.0 V for instance. Moreover, the power circuit 10 outputs a signal (CONT_RST) to the memory controller 22 and outputs a signal (FLASH_WP) to the flash memory 21. The signals will be described later.

Figure 2:
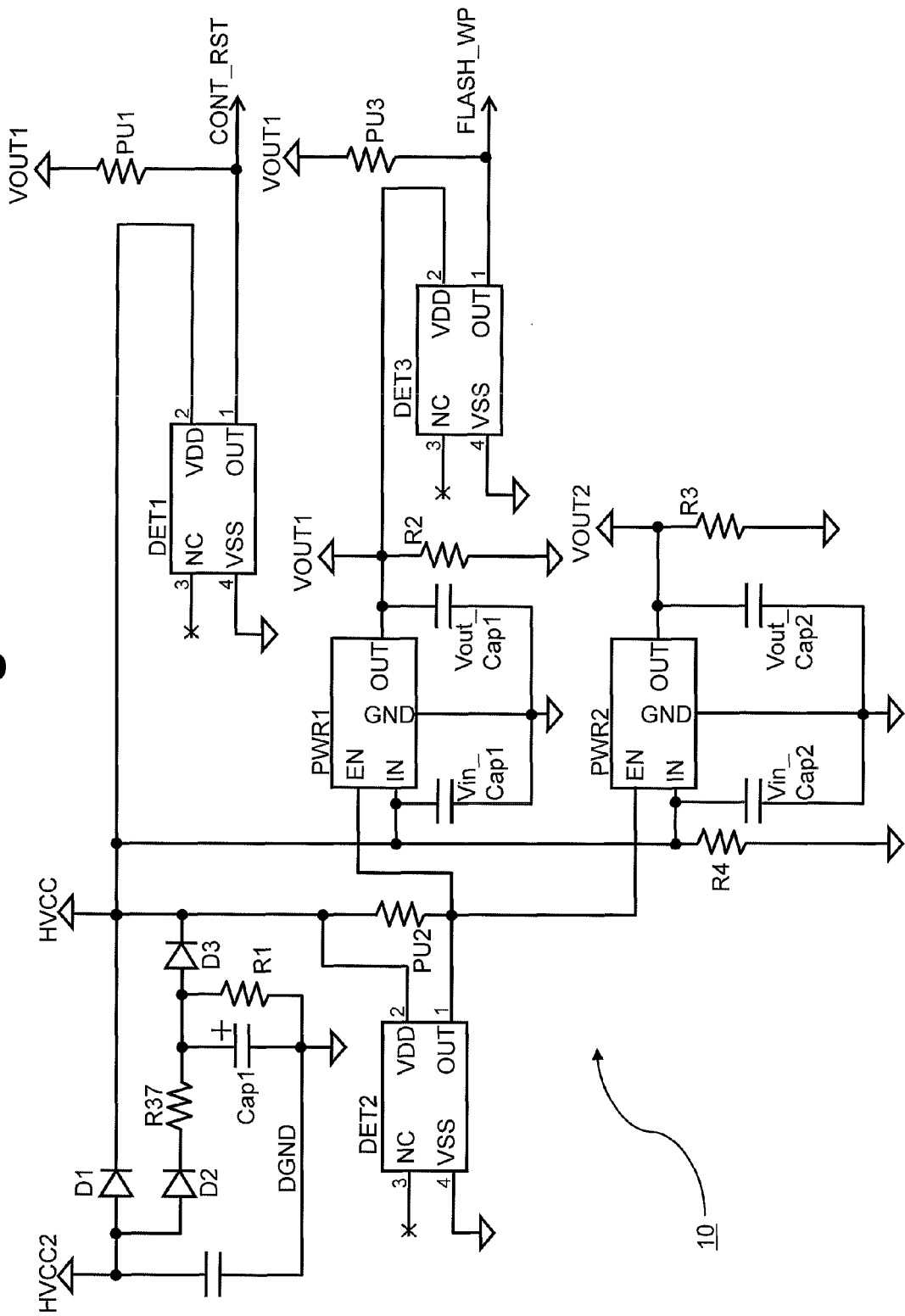
FIG. 2 shows a configuration example of a power circuit 10 in accordance with the embodiment 1.

FIG. 2 shows a configuration example of the power circuit 10 in accordance with the embodiment 1. In FIG. 2, VOUT1 indicates an output to the memory controller 22 and the flash memory 21, VOUT2 indicates an output to the memory controller 22, HVCC2 indicates a power feeding from the power supply circuit 20, and PU indicates a pull-up.

The power circuit 10 includes a capacitor (Cap1) that is an example of a first input side charging means, first and second voltage regulation circuits (PWR1 and PWR2), and first to third voltage detection circuits (DET1, DET2, and DET3) that are an example of a detection means. The number of the voltage regulation circuits is equal to the number of types of operating voltages that are supplied from the power circuit 10. In other words, since there are two types of operating voltages (3.3 V and 1.0 V) that are supplied from the power circuit 10, the number of the voltage regulation circuits is 2. However, the number of the voltage regulation circuits can also be less or larger than 2 in accordance with the number of types of operating voltages. Moreover, the number of the voltage detection circuits can also be less or larger than 3. Each of the voltage regulation circuits (PWR1 and PWR2) is provided with at least one capacitor on an input side (Vin_Cap1 and Vin_Cap2) and at least one capacitor on an output side (Vout_Cap1 and Vout_Cap2).

The capacitor (Cap1) is charged by an input voltage (Vin−Vd2) that is obtained by subtracting a voltage drop (Vd2) at a diode D2 from a power supply voltage (Vin) that is supplied. In the case in which a supply of a power supply voltage (Vin) is cut off or a power supply voltage (Vin) is dropped drastically, a charging voltage of the capacitor (Cap1) is supplied to each of the voltage regulation circuits (PWR1 and PWR2). A capacity of the capacitor (Cap1) is set to a capacity in which a predetermined operating voltage can be supplied to the memory controller 22 and the flash memory 21 until a control of interrupting a processing (hereafter referred to as a processing interruption control) is completed or an internal processing of the flash memory 21 is completed even if a power supply voltage (Vin) is dropped drastically when the memory controller 22 executes a writing processing or a reading processing to the flash memory 21. A capacity of the capacitor (Cap1) is larger than a capacity of the capacitors (Vin_Cap1 and Vin_Cap2) on the input side of the voltage regulation circuits (PWR1 and PWR2) and a capacity of the capacitors (Vout_Cap1 and Vout_Cap2) on the output side that is an example of a first output charging means for instance. The capacitor (Cap1) is an aggregate of a plurality of capacitors for instance.

The first voltage detection circuit (DET1) is a circuit that is configured to judge whether or not a voltage that has been input to the circuit (DET1) is less than a first setting value (for instance, 3.8 V) and to output a reset signal in the case in which the result of the judgment is positive. More specifically, any higher one of the following voltages (A) and (B) is input to an input terminal (a VDD terminal) of the circuit (DET1):

(A) a first voltage (Vin−Vd1) that is obtained by subtracting a voltage drop (Vd1) at a diode D1 from a power supply voltage (Vin); and (B) a second voltage (Cap1 voltage−Vd3) that is obtained by subtracting a voltage drop (Vd3) at a diode D3 from a charging voltage of the capacitor (Cap1).

The circuit (DET1) sets a level of a signal (CONT_RST) that is output from an output terminal (an OUT terminal) to be a reset release level (for instance, a high level) in the case in which a voltage that has been input to the VDD terminal is equal to or larger than a first setting value. The circuit (DET1) sets a level of a signal (CONT_RST) to be a reset level (for instance, a low level) in the case in which the circuit (DET1) detects that a voltage that has been input to the VDD terminal is less than a first setting value. The signal (CONT_RST) is input to the memory controller 22. In the case in which the memory controller 22 detects that a level of a signal (CONT_RST) becomes a reset level (that is, a reset signal is input), the memory controller 22 executes a reset processing for a reset of the memory controller 22. The reset processing can also include a control of interrupting a writing processing or a reading processing to the flash memory 21 (that is, a processing interruption control described before) for instance.

The second voltage detection circuit (DET2) is a circuit that is configured to judge whether or not a voltage that has been input to the circuit (DET2) is less than a second setting value that is less than the first setting value and to output a stop signal in the case in which the result of the judgment is positive. More specifically, any higher one of the first voltage (Vin−Vd1) and the second voltage (Cap1 voltage−Vd3) is input to an input terminal (a VDD terminal) of the circuit (DET2). The circuit (DET2) sets a level of a signal (EN) that is output from an output terminal (an OUT terminal) to be a stop release level (for instance, a high level) in the case in which a voltage that has been input to the VDD terminal is equal to or larger than a second setting value. The circuit (DET2) sets a level of a signal (EN) to be a stop level (for instance, a low level) in the case in which the circuit (DET2) detects that a voltage that has been input to the VDD terminal is less than a second setting value. The second setting value is a voltage value in which an operation of a writing processing to the flash memory 21 is guaranteed for instance, 2.7 V as a specific example. The signal (EN) is input to an enable terminal (an EN terminal) of the first voltage regulation circuit (PWR1).

The third voltage detection circuit (DET3) is a circuit that is configured to judge whether or not a voltage that has been input to the circuit (DET3) is less than a second setting value and to output a write protect signal in the case in which the result of the judgment is positive. More specifically, an output terminal (an OUT terminal) of the first voltage regulation circuit (PWR1) is coupled to an input terminal (a VDD terminal) of the circuit (DET3), and any higher one of the following voltages (a) and (b) is input to the VDD terminal:
(a) a first operating voltage (3.3 V for instance) that has been output from the output terminal (an OUT terminal) of the first voltage regulation circuit (PWR1); and
(b) a charging voltage of an output side capacitor (Vout_Cap1) that has been charged by the first operating voltage.

The circuit (DET3) sets a level of a signal (FLASH_WP) that is output from an output terminal (an OUT terminal) to be a write protect release level (for instance, a high level) in the case in which a voltage that has been input to the VDD terminal is equal to or larger than a second setting value. The circuit (DET3) sets a level of a signal (FLASH_WP) to be a write protect level (for instance, a low level) in the case in which the circuit (DET3) detects that a voltage that has been input to the VDD terminal is less than a second setting value. The signal (FLASH_WP) is input to the flash memory 21. In the case in which the flash memory 21 detects that a level of a signal (FLASH_WP) becomes a write protect level (that is, a write protect signal is input), the flash memory 21 does not execute a writing processing to the flash memory 21 until a write protect release is detected after that.

At least one of the first and second voltage regulation circuits (PWR1 and PWR2) is provided with a discharging function. In the present embodiment, the both of the first and second voltage regulation circuits (PWR1 and PWR2) are provided with a discharging function.

The first voltage regulation circuit (PWR1) will be described as an example. The first voltage regulation circuit (PWR1) is provided with the following two functions in large part:
(1) A function of regulating any higher one of the above first voltage (Vin−Vd1) and the above second voltage (Cap1 voltage−Vd3) to be a first operating voltage (3.3 V for instance) and of outputting the voltage: and
(2) A discharging function of stopping a function of regulating and outputting the first operating voltage (3.3 V for instance) in the case in which a stop signal (a signal (EN) of a low level) is input to the EN terminal and of discharging an electric charge of an output side capacitor (Vout_Cap1) that has been charged by the first operating voltage.

More specifically, any higher one of the above first and second voltages is input to the input terminal (an IN terminal) of the first voltage regulation circuit (PWR1), and an input side capacitor (Vin_Cap1) that is charged by the higher voltage is coupled to the IN terminal. An output side capacitor (Vout_Cap1) that is charged by the first operating voltage is coupled to the OUT terminal of the first voltage regulation circuit (PWR1). A voltage side that is lower than the first operating voltage (GND in a quintessential way) is coupled to the predetermined terminal (a GND terminal) of the first voltage regulation circuit (PWR1).

The first operating voltage that has been output from the first voltage regulation circuit (PWR1) is supplied to the flash memory 21 and the memory controller 22 and is input to the VDD terminal of the third voltage detection circuit (DET3). In the case in which a value of a voltage that has been input to the IN terminal is equal to or less than a value of the first operating voltage (3.3 V for instance), the first voltage regulation circuit (PWR1) outputs a voltage of a value that is almost equal to the value of a voltage that has been input as the first operating voltage. On the other hand, in the case in which a value of a voltage that has been input is higher than a value of the first operating voltage, the first voltage regulation circuit (PWR1) outputs a voltage of a value of the first operating voltage as the first operating voltage.

In the case in which a stop release signal (an EN signal of a high level) has been input to the EN terminal of the first voltage regulation circuit (PWR1), the IN terminal and the OUT terminal are coupled to each other for the circuit (PWR1) as shown in FIG. 3A (for instance, a switching element that is disposed between the IN terminal and the OUT terminal is in an ON state when a stop release signal is being input to the element). Consequently, the first operating voltage based on a voltage that has been input to the IN terminal is output from the OUT terminal. However, in the case in which a stop signal (an EN signal of a low level) is input to the EN terminal of the first voltage regulation circuit (PWR1), the IN terminal and the OUT terminal are disconnected from each other for the circuit (PWR1) as shown in FIG. 3B (for instance, a switching element that is disposed between the IN terminal and the OUT terminal is turned off when a stop signal is input to the element). Consequently, the electricity that has been charged to the output side capacitor (Vout_Cap1) is discharged through the GND terminal of the circuit (PWR1).

A substantive function of the second voltage regulation circuit (PWR2) is equivalent to that of the first voltage regulation circuit (PWR1).

In other words, the second voltage regulation circuit (PWR2) is provided with the following two functions in large part:
(1) A function of regulating any higher one of the above first voltage (Vin−Vd1) and the above second voltage (Cap1 voltage−Vd3) to be a second operating voltage (1.0 V for instance) that is lower than the first operating voltage and of outputting the voltage: and
(2) A discharging function of stopping a function of regulating and outputting the second operating voltage (1.0 V for instance) in the case in which a stop signal (a signal (EN) of a low level) is input to the EN terminal and of discharging an electric charge of an output side capacitor (Vout_Cap2) that has been charged by the second operating voltage.

More specifically, any higher one of the above first and second voltages is input to the input terminal (an IN terminal) of the second voltage regulation circuit (PWR2), and an input side capacitor (Vin_Cap2) that is charged by the higher voltage is coupled to the IN terminal. An output side capacitor (Vout_Cap2) that is charged by the second operating voltage is coupled to the OUT terminal of the second voltage regulation circuit (PWR2). A voltage side that is lower than the second operating voltage (GND in a quintessential way) is coupled to the predetermined terminal (a GND terminal) of the second voltage regulation circuit (PWR2).

The second operating voltage that has been output from the second voltage regulation circuit (PWR2) is supplied to the memory controller 22 (in particular, a microcomputer in the memory controller 22). In the case in which a value of a voltage that has been input to the IN terminal is equal to or less than a value of the second operating voltage (1.0 V for instance), the second voltage regulation circuit (PWR2) outputs a voltage of a value that is almost equal to the value of a voltage that has been input as the second operating voltage. On the other hand, in the case in which a value of a voltage that has been input is higher than a value of the second operating voltage, the second voltage regulation circuit (PWR1) outputs a voltage of a value of the second operating voltage as the second operating voltage.

In the case in which a stop release signal (an EN signal of a high level) has been input to the EN terminal of the second voltage regulation circuit (PWR2), the second operating voltage based on a voltage that has been input to the IN terminal is output from the OUT terminal. However, in the case in which a stop signal (an EN signal of a low level) is input to the EN terminal of the second voltage regulation circuit (PWR2), the electricity that has been charged to the output side capacitor (Vout_Cap2) is discharged through the GND terminal of the circuit (PWR2).

In accordance with the power circuit 10, a discharging circuit that includes the second voltage detection circuit (DET2) and a discharging function of the first and second voltage regulation circuits (PWR1 and PWR2) is implemented.

A flow of an operation that is executed by the power circuit 10 will be described in the following.

In the case in which the first voltage detection circuit (DET1) detects that any higher one of the first voltage (Vin−Vd1) and the second voltage (Cap1 voltage−Vd3) (a voltage that has been input to a VDD terminal of the circuit (DET1)) is lower than a first setting value (3.8 V for instance), the first voltage detection circuit (DET1) transmits a reset signal to the memory controller (sets the CONT_RST signal to be a low level). By this configuration, the memory controller 22 stops a writing processing to the flash memory 21.

After that, any higher one of the first voltage (Vin−Vd1) and the second voltage (Cap1 voltage−Vd3) is lowered to be less than a second setting value. In the case in which the second voltage detection circuit (DET2) detects that any higher one of the first voltage (Vin−Vd1) and the second voltage (Cap1 voltage−Vd3) (a voltage that has been input to a VDD terminal of the circuit (DET2)) is lower than a second setting value (2.7 V for instance), the second voltage detection circuit (DET2) transmits a stop signal from the OUT terminal of the circuit (DET2) (sets the signal (EN) to be a low level). The stop signal is input to the EN terminal of the both voltage regulation circuits (PWR1 and PWR2) simultaneously in a substantial way. The voltage regulation circuits (PWR1 and PWR2) stop the output when the stop signal is input to the EN terminal and discharge an electric charge of the output side capacitors (Vout_Cap1 and Vout_Cap2) of the circuits (PWR1 and PWR2). By this configuration, a discharge of the output side capacitors (Vout_Cap1 and Vout_Cap2) of the both voltage regulation circuits (PWR1 and PWR2) is started simultaneously in a substantial way.

For the power circuit 10 in accordance with the embodiment 1, in the case in which any higher one of the first voltage (Vin−Vd1) and the second voltage (Cap1 voltage−Vd3) is lower than a second setting value, a discharge of the output side capacitors (Vout_Cap1 and Vout_Cap2) of the voltage regulation circuits (PWR1 and PWR2) is executed. By this configuration, a charging voltage of the output side capacitors (Vout_Cap1 and Vout_Cap2) can be lowered to be equal to or less than a predetermined voltage value within a specified time after any higher one of the first voltage (Vin−Vd1) and the second voltage (Cap1 voltage−Vd3) becomes lower than a second setting value.

Moreover in accordance with the embodiment 1, a discharge of the output side capacitor (Vout_Cap1) of the first voltage regulation circuit (PWR1) and a discharge of the output side capacitor (Vout_Cap2) of the second voltage regulation circuit (PWR2) are started simultaneously in a substantial way. By this configuration, a potential of a latch-up caused by an extent of a difference of operating voltages can be reduced.

Moreover in accordance with the embodiment 1, an electric charge of the capacitor (Cap1) and an electric charge of the input side capacitors (Vin_Cap1 and Vin_Cap2) are discharged in a time longer than that of the case of the output side capacitors (Vout_Cap1 and Vout_Cap2). More specifically, an electric charge of the capacitor (Cap1) is discharged by a resistor R1. An electric charge of the input side capacitors (Vin_Cap1 and Vin_Cap2) is discharged by a resistor R4.

Moreover in accordance with the embodiment 1, since the IN terminal and the OUT terminal of the voltage regulation circuits (PWR1 and PWR2) are electrically disconnected, it is possible that a voltage is not applied to each device in the latter stage of the voltage regulation circuit in a long-winded manner even if an electric charge of the capacitor (Cap1) and an electric charge of the input side capacitors (Vin_Cap1 and Vin_Cap2) remain.

Moreover in accordance with the embodiment 1, in the case in which the first operating voltage (3.3 V) that is output from the first voltage regulation circuit (PWR1) is lower than a second setting value, a write protect signal is output to the flash memory 21. More specifically, in the case in which any higher one of the first voltage (Vin−Vd1) and the second voltage (Cap1 voltage−Vd3) is lower than a second setting value, a stop signal is input from the second voltage detection circuit (DET2) to the EN signal of the first voltage regulation circuit (PWR1). In this case, the first operating voltage is not output from the first voltage regulation circuit (PWR1). Consequently, since a voltage that is input to the VDD terminal of the third voltage detection circuit (DET3) is lower than a second setting value, the third voltage detection circuit (DET3) outputs a write protect signal and executes a write protect of the flash memory 21.

Moreover, although the voltage detection circuit (DET1) is disposed in the latter stage of the diode 1, it is not always necessary that the voltage detection circuit (DET1) is disposed in the latter stage of the diode 1.

Moreover, an order and a length of a voltage that is to be discharged can also be controlled based on a detection voltage or a length of a time constant of a voltage detection circuit.

Embodiment 2

An embodiment 2 of the present invention will be described below in detail. In the following, the points different from those of the embodiment 1 will be described mainly, and the descriptions of the common points with the embodiment 1 will be omitted or simplified.

Figure 4:
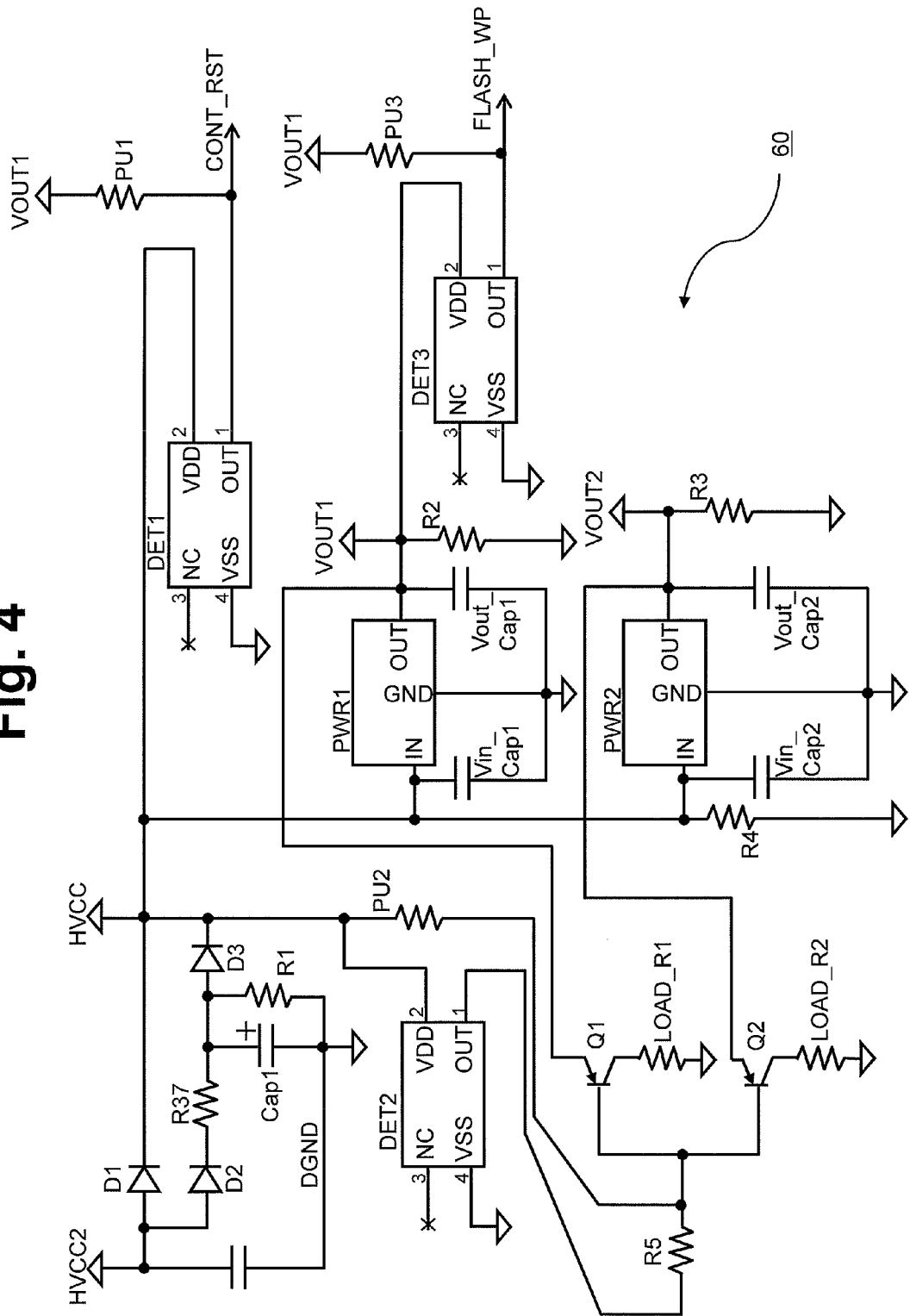
FIG. 4 shows a configuration example of a power circuit 60 in accordance with an embodiment 2.

FIG. 4 shows a configuration example of a power circuit 60 in accordance with the embodiment 2.

For the power circuit 60, the voltage regulation circuits (PWR1 and PWR2) are not provided with a discharging function (are not provided with an EN terminal). The power circuit 60 is provided with a transistor for every voltage regulation circuit. More specifically, the power circuit 60 is provided with the first and second transistors (Q1 and Q2) that are corresponded to the first and second voltage regulation circuits (PWR1 and PWR2), respectively. At least one of the transistors (Q1) and (Q2) can also be a switching element of other type such as a MOS-FET (Metal-Oxide-Semiconductor Field-Effect Transistor).

The transistor (Q1) is a transistor of a PNP type. The output side capacitor (Vout_Cap1) is coupled to an emitter terminal of the transistor (Q1). A collector terminal of the transistor (Q1) is coupled to the ground via a resistor (LOAD_R1), and a base terminal of the transistor (Q1) is coupled to an OUT terminal of the second voltage detection circuit (DET2) via a resistor (R5).

The transistor (Q2) is also a transistor of a PNP type. The output side capacitor (Vout_Cap2) is coupled to an emitter terminal of the transistor (Q2). A collector terminal of the transistor (Q2) is coupled to a ground via a resistor (LOAD_R2), and a base terminal of the transistor (Q2) is coupled to an OUT terminal of the second voltage detection circuit (DET2) via a resistor (R5).

In the embodiment 2, a discharging circuit is implemented by the second voltage detection circuit (DET2) and the transistors (Q1) and (Q2).

In the case in which any higher one of the first voltage (Vin−Vd1) and the second voltage (Cap1 voltage−Vd3) is equal to or larger than a second setting value, the transistors (Q1) and (Q2) are in an OFF state as shown in FIG. 5A. Consequently, the first and second operating voltages are output from of the first and second voltage regulation circuits (PWR1 and PWR2) and charged to the capacitors (Cap1, Vout_Cap1, Vout_Cap2, Vin_Cap1, and Vin_Cap2).

In the case in which the second voltage detection circuit (DET2) detects that any higher one of the first voltage (Vin−Vd1) and the second voltage (Cap1 voltage−Vd3) is lowered to be less than a second setting value, a stop signal is output from the OUT terminal of the second voltage detection circuit (DET2). More specifically, a level of a signal that is input to the base terminal of the transistors (Q1) and (Q2) is changed from a high level to a low level for instance. By this configuration, the transistors (Q1) and (Q2) are turned on simultaneously in a substantial way as shown in FIG. 5B. As a result, a discharge of the output side capacitors (Vout_Cap1 and Vout_Cap2) and a discharge of the capacitor (Cap1) and the input side capacitors (Vin_Cap1 and Vin_Cap2) are started simultaneously in a substantial way. More specifically, an electric charge of the output side capacitor (Vout_Cap1) is flown to the ground through the transistor (Q1), and an electric charge of the capacitor (Cap1) and the input side capacitor (Vin_Cap1) is flown to the ground through the voltage regulation circuit 1 and the transistor (Q1). Similarly, an electric charge of the output side capacitor (Vout_Cap2) is flown to the ground through the transistor (Q2), and an electric charge of the capacitor (Cap1) and the input side capacitor (Vin_Cap2) is flown to the ground through the voltage regulation circuit 2 and the transistor (Q2).

In accordance with the embodiment 2, in the case in which any higher one of the first voltage (Vin−Vd1) and the second voltage (Cap1 voltage−Vd3) is lower than a second setting value, not only an electric charge of the output side capacitors (Vout_Cap1 and Vout_Cap2) but also an electric charge of the capacitor (Cap1) and the input side capacitors (Vin_Cap1 and Vin_Cap2) can be discharged in a proactive manner.

Moreover, in the case in which a time of a discharge is regulated, a control can be possible by designing the resistance values of LOAD_R1 and LOAD_R2 to be desired values.

While the preferred embodiments in accordance with the present invention have been described above, the embodiments are examples for describing the present invention and the present invention is not restricted to the embodiments. In other words, the present invention can also be implemented in modes of other various types.

What is claimed is:

1. A power circuit configured to supply a first operating voltage to a flash memory and a memory controller, which controller configured to control an access to the flash memory, comprising:
    a first input side charging unit that is a charging unit configured to be charged by an input voltage that is supplied from the outside;
    a first voltage regulation unit configured to regulate any higher one of the input voltage and a charging voltage of the first input charging unit to be the first operating voltage and to output the voltage;
    a first output side charging unit that is a charging unit configured to be charged by the first operating voltage; and
    a discharging unit configured to discharge electricity that has been charged to the first output side charging unit in the case in which any higher one of the input voltage and the charging voltage becomes lower than the setting value.

2. A power circuit according to claim 1, wherein:
    the discharging unit includes:
    a detection unit configured to output a predetermined signal in the case in which the detection unit detects that any higher one of the input voltage and the charging voltage becomes lower than the setting value; and
    a switching element that is coupled to the first output side charging unit and that is configured to turn on in the case in which the predetermined signal is received.

3. A power circuit according to claim 2, further comprising:
a second input side charging unit that is a charging unit configured to be charged by a voltage that is any higher one of the input voltage and a charging voltage of the first input side charging unit and that is supplied to the first voltage regulation unit,
wherein electricity that has been charged to the second input side charging unit is discharged from the switching element via the first voltage regulation unit.

4. A power circuit according to claim 1, wherein:
the first voltage regulation unit includes:
an input unit configured to receive any higher one of the input voltage and a charging voltage of the first input side charging unit;
an output unit that is configured to output the first operating voltage based on an voltage that has been received by the input unit and that is coupled to a voltage side that is lower than the first operating voltage;
a signal detection unit configured to receive a predetermined signal; and
a discharging function configured to supply a charging voltage of the first output side charging unit to the lower voltage side by electrically disconnecting the input unit and the output unit in the case in which the signal detection unit receives the predetermined signal, and
the discharging unit includes:
the discharging function of the first voltage regulation unit; and
a signal output unit configured to output the predetermined signal when detecting that any higher one of the input voltage and the charging voltage becomes lower than the setting value.

5. A power circuit according to claim 1, further comprising:
a second voltage regulation unit configured to regulate any higher one of the input voltage and a charging voltage of the first input side charging unit to be a second operating voltage that is different from the first operating voltage and to output the voltage; and
a second output side charging unit that is a charging unit configured to be charged by the second operating voltage,
wherein the discharging unit discharges electricity that has been charged to the first output side charging unit and the second output side charging unit in the case in which any higher one of the input voltage and the charging voltage becomes lower than the setting value.

6. A flash memory system comprising:
a power circuit according to claim 1;
a flash memory configured to receive an operating voltage supplied from the power circuit; and
a memory controller configured to receive an operating voltage supplied from the power circuit and configured to control an access to the flash memory.

7. A method for supplying an operating voltage to a flash memory and a memory controller, which controller configured to control an access to the flash memory, comprising:
a step of regulating any higher one of an input voltage that is supplied from the outside and a charging voltage of a input side charging unit configured to be charged by the input voltage to be the operating voltage and outputting the voltage; and
a step of discharging electricity that has been charged to the output side charging unit configured to be charged by the operating voltage in the case in which any higher one of the input voltage and the charging voltage becomes lower than the setting value.

* * * * *